(12) United States Patent  
Mosden et al.

(10) Patent No.: US 10,600,687 B2
(45) Date of Patent: Mar. 24, 2020

(54) PROCESS INTEGRATION TECHNIQUES USING A CARBON LAYER TO FORM SELF-ALIGNED STRUCTURES

(71) Applicant: Tokyo Electron Limited, Minato-ku, Tokyo (JP)

(72) Inventors: Aelan Mosden, Poughkeepsie, NY (US); Kaushik Kumar, Heverlee (BE)

(73) Assignee: TOKYO ELECTRON LIMITED, Tokyo (JP)

( * ) Notice: Subject to any disclaimer, the term of this patent is extended or adjusted under 35 U.S.C. 154(b) by 84 days.

(21) Appl. No.: 15/491,786

(22) Filed: Apr. 19, 2017

(65) Prior Publication Data

US 2018/0308753 A1    Oct. 25, 2018

(51) Int. Cl.
| | |
|---|---|
| H01L 21/768 | (2006.01) |
| H01L 21/28 | (2006.01) |
| H01L 21/311 | (2006.01) |
| H01L 21/033 | (2006.01) |
| H01L 29/66 | (2006.01) |

(52) U.S. Cl.
CPC .... H01L 21/76897 (2013.01); H01L 21/0337 (2013.01); H01L 29/66545 (2013.01)

(58) Field of Classification Search
CPC ......... H01L 21/78697; H01L 21/28008; H01L 21/0337; H01L 21/76897; H01L 29/66545; H01L 21/6656
See application file for complete search history.

(56) References Cited

U.S. PATENT DOCUMENTS

| | | | | |
|---|---|---|---|---|
| 5,436,188 A | * | 7/1995 | Chen ................. | H01L 21/76897 257/E21.507 |
| 5,928,967 A | * | 7/1999 | Radens ............. | H01L 21/76897 257/E21.252 |
| 6,087,727 A | * | 7/2000 | Tsutsumi ............ | H01L 21/8232 257/296 |
| 6,133,142 A | * | 10/2000 | Tran .................. | H01L 21/32135 257/E21.31 |
| 6,162,737 A | * | 12/2000 | Weimer ............ | H01L 21/02126 257/437 |
| 6,287,951 B1 | * | 9/2001 | Lucas ............... | H01L 21/76801 257/E21.507 |
| 6,337,285 B1 | * | 1/2002 | Ko .................... | H01L 21/31116 216/67 |

(Continued)

Primary Examiner — Mary A Wilczewski
(74) Attorney, Agent, or Firm — Rothwell, Figg, Ernst & Manbeck, P.C.

(57) ABSTRACT

Process integration techniques are disclosed that use a carbon fill layer during formation of self-aligned structures. A carbon layer may be placed over an etch stop layer. A cap layer may be provided over the carbon layer. The carbon layer may fill a high aspect ratio structure formed on the substrate. The carbon layer may be removed from a substrate in a highly selective removal technique in a manner that does not damage underlying layers. The carbon layer may fill a self-aligned contact region that is provided for a self-aligned contact process flow. A tone inversion mask may be used to protect multiple self-aligned contact regions. With the blocking mask in place, the carbon layer may be removed from regions that are not the self-aligned contact region. After removal of the blocking mask, the carbon layer which fills the self-aligned contacts may then be removed.

20 Claims, 10 Drawing Sheets

(56) References Cited

U.S. PATENT DOCUMENTS

| | | | | |
|---|---|---|---|---|
| 6,348,706 B1* | 2/2002 | Sandhu | H01L 21/02126 | 257/296 |
| 6,352,917 B1* | 3/2002 | Gupta | H01L 21/76801 | 257/E21.576 |
| 6,362,094 B1* | 3/2002 | Dabbaugh | H01L 21/76832 | 257/E21.507 |
| 6,897,159 B1* | 5/2005 | Lee | H01L 21/02063 | 257/E21.252 |
| 9,214,392 B1* | 12/2015 | Lu | H01L 21/82347 | |
| 9,312,383 B1* | 4/2016 | Cheng | H01L 29/7827 | |
| 9,543,366 B2* | 1/2017 | Xie | H01L 27/3244 | |
| 9,548,366 B1* | 1/2017 | Ho | H01L 29/6656 | |
| 9,741,615 B1* | 8/2017 | Zang | H01L 21/76897 | |
| 9,818,641 B1* | 11/2017 | Bouche | H01L 21/31144 | |
| 9,911,623 B2* | 3/2018 | Chang | H01L 21/76808 | |
| 9,941,164 B1* | 4/2018 | Kim | H01L 21/76897 | |
| 10,109,526 B1* | 10/2018 | Zhang | H01L 21/76897 | |
| 10,134,633 B1* | 11/2018 | Kamineni | H01L 29/785 | |
| 10,153,351 B2* | 12/2018 | Hsu | H01L 21/76867 | |
| 10,157,790 B1* | 12/2018 | You | H01L 21/76897 | |
| 10,236,364 B1* | 3/2019 | Cheng | H01L 29/66977 | |
| 10,249,533 B1* | 4/2019 | Shearer | H01L 21/76897 | |
| 2002/0086509 A1* | 7/2002 | Park | H01L 21/76895 | 438/586 |
| 2002/0113315 A1* | 8/2002 | Chung | H01L 21/76825 | 257/759 |
| 2004/0038546 A1* | 2/2004 | Ko | H01L 21/31116 | 438/710 |
| 2004/0053490 A1* | 3/2004 | Nagao | H01L 21/31116 | 438/637 |
| 2004/0056281 A1* | 3/2004 | Shin | H01L 21/76831 | 257/213 |
| 2005/0064727 A1* | 3/2005 | Lee | H01L 21/31111 | 438/781 |
| 2005/0136649 A1* | 6/2005 | Lee | H01L 21/76897 | 438/637 |
| 2006/0073699 A1* | 4/2006 | Lee | H01L 21/76897 | 438/639 |
| 2006/0110884 A1* | 5/2006 | Wang | G11C 11/404 | 438/270 |
| 2006/0154460 A1* | 7/2006 | Yun | H01L 21/76897 | 438/586 |
| 2006/0170058 A1* | 8/2006 | Chiang | H01L 21/0212 | 257/369 |
| 2008/0081446 A1* | 4/2008 | Lee | H01L 21/31116 | 438/585 |
| 2008/0093710 A1* | 4/2008 | Bach | H01L 21/31144 | 257/635 |
| 2008/0160759 A1* | 7/2008 | Lee | H01L 21/31144 | 438/672 |
| 2008/0200035 A1* | 8/2008 | Jung | H01L 21/0337 | 438/703 |
| 2008/0203586 A1* | 8/2008 | Bach | H01L 21/7681 | 257/786 |
| 2008/0305627 A1* | 12/2008 | Maekawa | H01L 21/76831 | 438/637 |
| 2010/0038723 A1* | 2/2010 | Babich | H01L 21/76816 | 257/384 |
| 2010/0270627 A1* | 10/2010 | Chang | H01L 21/28247 | 257/411 |
| 2012/0032238 A1* | 2/2012 | Teo | H01L 21/28518 | 257/288 |
| 2012/0139062 A1* | 6/2012 | Yuan | H01L 21/76897 | 257/411 |
| 2012/0261828 A1* | 10/2012 | Bruce | H01L 23/5222 | 257/774 |
| 2014/0264953 A1* | 9/2014 | Lim | H01L 21/76897 | 257/786 |
| 2017/0256628 A1* | 9/2017 | Lim | H01L 21/76897 | |
| 2018/0261510 A1* | 9/2018 | Qiu | H01L 29/4232 | |
| 2018/0292756 A1* | 10/2018 | Kong | H01L 21/0337 | |
| 2018/0308753 A1* | 10/2018 | Mosden | H01L 21/76897 | |
| 2019/0035677 A1* | 1/2019 | Chandhok | H01L 21/027 | |

\* cited by examiner

PROCESS INTEGRATION TECHNIQUES USING A CARBON LAYER TO FORM SELF-ALIGNED STRUCTURES

BACKGROUND

The present disclosure relates to semiconductor process integration techniques. More specifically, it provides a method for forming self-aligned structures during the manufacturing of semiconductor devices.

Semiconductor device formation involves a series of manufacturing techniques related to the formation, patterning and removal of a number of layers of material on a substrate. As device linewidths continue to shrink, various individual processing steps require associated improvements. For example, as devices sizes shrink, layer thicknesses shrink and aspect ratios increase, the etch selectivity between one layer and another layer may need to increase accordingly. At times, as device criteria continue to shrink improvements to an individual processing step may not be sufficient to meet the desired device criteria. Thus, the integration of the overall process flow of the individual process steps also may be modified to provide a repeatable, stable process flow which satisfies shrinking device criteria.

One process integration technique utilized to satisfy demanding design criteria is the formation of self-aligned structures. The use of such self-aligned structures allows the formation of structures that may be smaller than the normal lithography or etch tolerances and allows tighter layer to layer alignment tolerances. Thus, as is known in the art, a variety of self-aligned techniques may be utilized to form structures such as self-aligned contacts or self-aligned gates. In some cases, the self-aligned process flow may utilize tone inversion photolithography masking techniques in which rather than defining the individual structures to be formed, the photolithography mask blocks an area that does not define one individual structure, again as is well known in the art. Such tone inversion processes provide a method to reduce damage to features in critical areas.

SUMMARY

The present disclosure provides process integration techniques using carbon layers to form self-aligned structures. In one embodiment, a semiconductor manufacturing process flow is disclosed in which an etch stop layer is formed on a substrate. A carbon layer comprised of a carbon material may then be placed directly or indirectly over the etch stop layer. A cap layer may then be provided over the carbon layer. The carbon layer provides a material which may be removed from the substrate in a highly selective manner relative to the etch stop material. In one embodiment, the carbon layer may be removed via an etching technique that, in one exemplary embodiment, provides greater than 100:1 selectivity to the etch stop layer. The cap layer provides protection to the carbon layer for one or more processing steps that occur after formation of the carbon layer. The use of a carbon layer provided over the etch stop layer provides a process integration flow in which the carbon layer may fill a high aspect ratio structure formed on the substrate. The carbon materials may be removed from a substrate in a highly selective removal technique in a manner that does not damage underlying semiconductor processing layers.

In one embodiment, the carbon layer is used to fill the self-aligned contact region that is provided for a self-aligned contact process flow. The carbon layer may remain within the self-aligned contact region while subsequent semiconductor processing steps are performed on the substrate, protecting the self-aligned contact region during one or more of such subsequent steps. At the appropriate point in the process flow, the carbon layer may then be removed from the self-aligned contact region utilizing a highly selective removal technique. Then, subsequent conventional contact formation and conductor fill techniques may be utilized to complete the formation of the self-aligned contact as is known in the art.

In one embodiment, the subsequent process steps utilized after the carbon layer fills the self-aligned contact region may include the use of a tone inversion masking step. In such a step, a blocking mask may be utilized to protect multiple self-aligned contact regions. With the blocking mask in place the carbon layer may be removed from portions of the substrate that do not include the self-aligned contact region and replaced with an oxide or other insulator layer. After removal of the blocking mask, the carbon layer which fills the self-aligned contacts may then be removed to allow the subsequent completion of the contact formation and the associated conductor fill.

In another embodiment, a method to form self-aligned structures is provided. The method may comprise providing a substrate with patterned structures, the patterned structures including a self-aligned structure region in which a self-aligned structure will be formed. The method further includes forming an etch stop layer in the self-aligned structure region, filling at least a portion of the self-aligned structure region with a carbon layer and forming a cap layer over the self-aligned structure region above the carbon layer. The method also includes providing a blocking mask over the self-aligned structure region to protect at least a portion of the cap layer and the carbon layer in the self-aligned structure region from at least one processing steps performed after the blocking mask is formed. The method further includes removing the blocking mask from the self-aligned structure region, removing the cap layer and the carbon layer from the self-aligned structure region, and forming the self-aligned structure in the self-aligned structure region.

In still another embodiment, a method of utilizing a tone inversion process step to form self-aligned contacts is provided. The method may comprise providing a substrate having patterned structures which provide gate regions and self-aligned contact regions in which a self-aligned contact will be formed. The method further includes forming a gate liner above at least a portion of the gate regions and the self-aligned contact regions and providing a carbon layer above the gate liner in at least a portion of the gate regions and the self-aligned contact regions. The method then includes providing, over the self-aligned contact regions, a blocking mask above the carbon layer in the self-aligned contact regions and removing at least some of the carbon layer in areas not protected by the blocking mask. The method further includes removing the blocking mask from above the self-aligned contact regions, removing the carbon layer from the self-aligned contact regions, and forming the self-aligned contacts in the self-aligned contact regions.

In yet another embodiment, a method of tone inversion processing for providing self-aligned structures is provided. The method may comprise providing a patterned substrate comprising a plurality of gate formation structures. The method further includes performing an atomic layer deposition, chemical vapor deposition, or spin on process to add carbon material on the patterned substrate, the carbon material filling at least a portion of a self-aligned structure region, the self-aligned structure region being where the self-aligned structures will be subsequently formed. The method may also include forming a cap layer above the carbon material and fabricating a gate conductor by removing layers or features of the gate formation structures as part of a gate conductor fabrication process, the removal of the layers or features leaving at least a portion of the cap layer on the patterned substrate. The method may further include performing a removal of the cap layer, and performing a removal of the carbon material in the self-aligned structure region.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
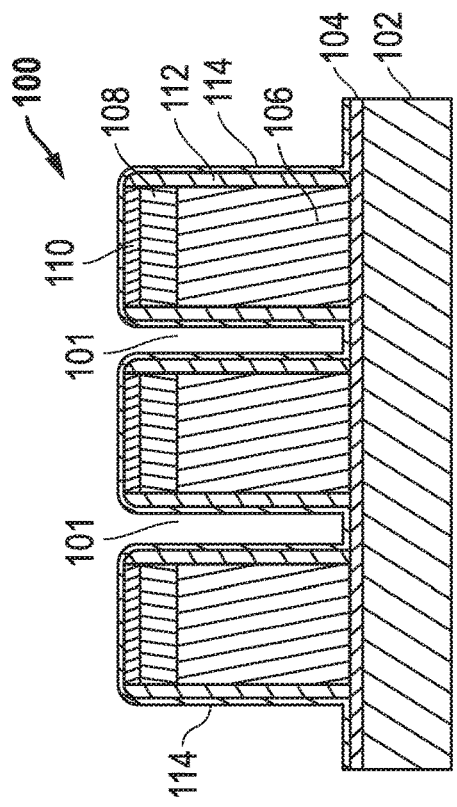
FIGS. 1A-1I illustrate an exemplary process flow for the formation of a self-aligned structure.

The present disclosure provides techniques for accommodating a semiconductor manufacturing process flow in which highly selective layer to layer etch tolerances are mandated by using a carbon layer fill technique as described herein. In one embodiment, the high etch selectivity is required during the formation of a self-aligned structure. In another embodiment, the high etch selectivity is required during the formation of a self-aligned contact. Such a structure is one example of a semiconductor structure that may utilize self-aligned process techniques that also require high etch selectivity.

The present techniques relate to the process integration of a variety of process layers formed on and/or removed from a substrate. As used herein, a substrate may be considered to be a starting substrate wafer (whether it be a single layered substrate or multilayer substrate (such as, for example, a silicon on insulator (SOI) wafer). In addition as used herein, a substrate may also refer to (1) the starting substrate with the addition of additional process layers formed on and/or in the starting semiconductor substrate and/or (2) the layers that remain for additional processing after the removal of a starting substrate.

In one broad aspect, the present techniques provide for utilizing a process flow in which an etch stop layer is formed on a substrate and a carbon layer comprised of a carbon material is then be placed directly or indirectly over the etch stop layer. A cap layer may then be provided over the carbon layer. The carbon layer provides a material which may be removed from the substrate in a highly selective manner relative to the etch stop material. In one embodiment, the carbon layer may be removed via an etching technique that, in one exemplary embodiment, provides greater than 100:1 selectivity to the etch stop layer. The cap layer is also a layer that may be removed selectively relative to the etch stop layer. However, the cap layer etch selectivity relative to the etch stop layer may be much less than the carbon removal etch. In fact, in one embodiment, the etch used to remove the cap layer need not provide any selectivity to the etch stop layer. The use of a carbon layer provided over the etch stop layer provides a process integration flow in which the carbon layer may fill a high aspect ratio structure formed on the substrate. Because carbon materials may be removed from a substrate in highly selective removal techniques in a manner that does not damage underlying semiconductor processing layers, the use of a carbon fill layer provides an advantageous process flow.

In one embodiment, the carbon layer is used to fill a self-aligned structure region that, in one embodiment, is the self-aligned contact region that is provided for a self-aligned contact process flow. The carbon layer may remain within the self-aligned contact region while subsequent semiconductor processing steps are performed on the wafer, protecting the self-aligned contact region during at least some of such subsequent steps. At the appropriate point in the process flow, the carbon layer may then be removed from the self-aligned contact region utilizing a highly selective removal technique. Then, subsequent conventional contact formation and conductor fill techniques may be utilized to complete the formation of the self-aligned contact as is known in the art.

In one embodiment, the subsequent process steps utilized after the carbon layer fills the self-aligned contact region may include the use of a tone inversion masking step. In such a step, a blocking mask may be utilized to protect multiple contact regions. With the blocking mask in place, the carbon layer may be removed from portions of the substrate that do not include the self-aligned contact region and replaced with an oxide or other insulator layer. After removal of the blocking mask, the carbon layer which fills the self-aligned contacts may then be removed to allow the subsequent completion of the contact formation and the associated conductor fill.

In one embodiment, the etch stop layer may be a silicon nitride based layer and the cap layer may be an oxide based layer. In another embodiment, the layers may be reversed so that the etch stop layer is an oxide based layer and the cap layer is a silicon nitride based layer.

The advantages of utilizing a carbon layer fill technique as described herein may be seen by comparing the process flow of FIGS. 1A-1I to the process flow of FIGS. 2A-2M. The process flow of FIGS. 1A-1I does not utilized a carbon layer fill technique while the process flow of FIGS. 2A-2M demonstrates the alterations to the process flow of FIGS. 1A-1I that may advantageously utilize a carbon layer fill process. As shown in the figures, a self-aligned contact formation process flow is illustrated, such as for example, a self-aligned contact formed for use in a fin field effect transistor (FinFET) device. As is well known in the art, a FinFET is a type of nonplanar field effect transistor. It will be recognized that the particular structures being formed and process flow shown in the figures are merely exemplary. However, comparisons of the process flow of FIGS. 1A-1I to that of the process flow of FIGS. 2A-2M will demonstrate to those skilled in the art how the use of a carbon fill layer may be incorporated into a process flow in which a highly selective layer removal step is required. Thus, those skilled in the art will recognize that the techniques disclosed herein are not limited to self-aligned contacts or even self-aligned structures in general, but may be relevant to a wide range of semiconductor process flows.

As shown in FIG. 1A, a patterned substrate is provided as a semiconductor structure 100 which has a variety of patterned structures. It will be recognized that the semiconductor structure 100 is merely exemplary and the various layers shown in the figures are merely exemplary. Thus, alternative process flows and alternative layers and materials may be utilized while still obtaining the benefits of the carbon layer fill techniques disclosed herein. The semiconductor structure 100 includes a substrate 102, dielectric layer 104 (for example a high dielectric constant (K) dielectric material), dummy silicon 106 (for example amorphous silicon or polysilicon), a first dummy silicon cap 108 (for example a nitride layer), a second dummy silicon cap 110 (for example an oxide layer), and a spacer 112 (for example an oxide or a low K dielectric material). The dummy silicon 106 is used as a gate formation structure as described below as gates will subsequently be formed in a region formed by the removal of the dummy silicon. Also shown in FIG. 1A is a self-aligned contact region 101 within which self-aligned contact structures may eventually be formed.

Figure 1B:
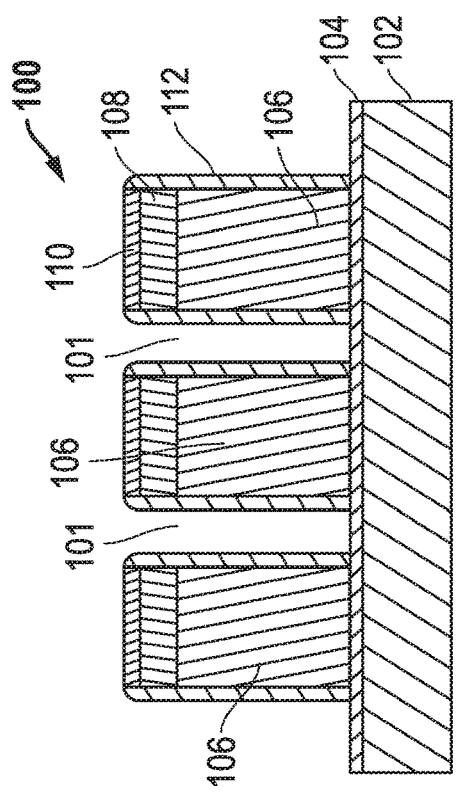

As shown in FIG. 1B, an etch stop layer 114 (in one example silicon nitride) may then be formed over the semiconductor structure 100. The etch step layer 114 may be one material or a combination of materials, including but not limited to, silicon nitride, silicon oxycarbonitride, silicon oxycarbide, silicon carbide, silicoboron carbonitride, silicon boron nitride, hafnium oxide, zirconium oxide, titanium oxide, etc. The illustrative embodiment of the figures provides for the formation of a self-aligned contact region. Thus, in this embodiment, the etch stop layer 114 is a gate liner layer of a gate having adjacent self-aligned contacts.

Figure 1C:
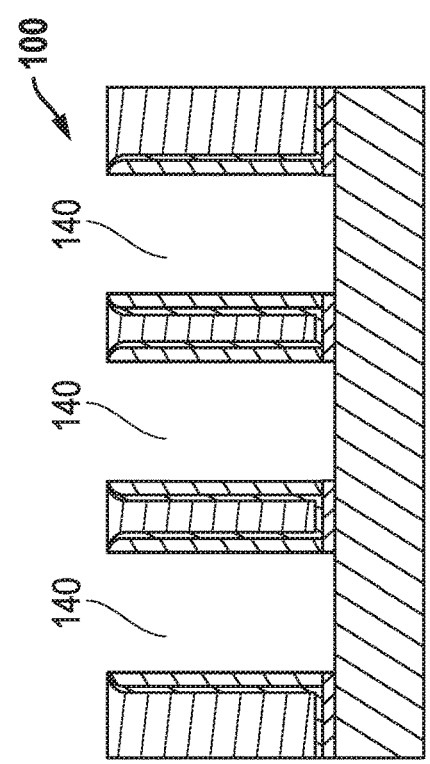
Figure 1D:
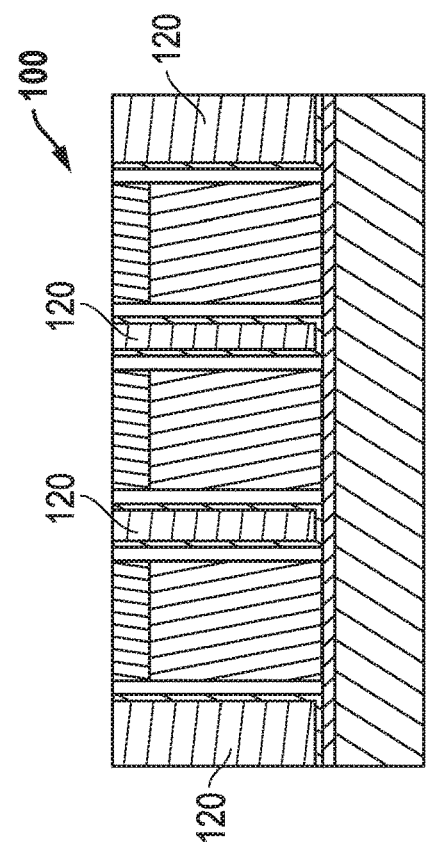
Figure 1E:
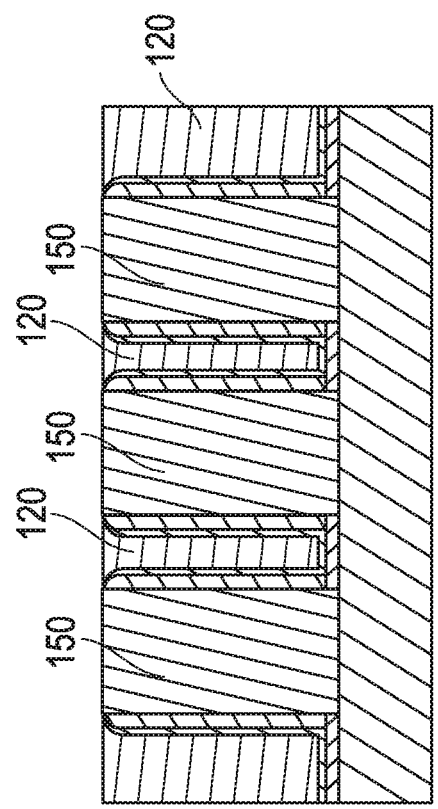

A dielectric layer 120 (for example an oxide) may be formed over the semiconductor structure and then etched or planarized back to leave the structure shown in FIG. 1C. Then, as shown in FIG. 1D an etch process may be utilized to remove the dummy caps 108 and 110 and the dummy silicon 106. Such a process leaves gate regions 140 within which gates may be later formed. A gate conductor fabrication process may then provide a gate conductor 150 in the gate region 140 as shown in FIG. 1E. Though shown in the figures as a single layer gate conductor 150, it will be recognized that the gate conductor 150 may be formed from one layer or may be a conductive laminate of a more than one layer to form a gate conductor material. It will also be recognized that, though not shown, a gate dielectric may be formed under the gate conductor 150. Thus, a gate dielectric may be deposited or grown under the gate conductor 150, such as for example, a silicon oxide layer, silicon oxide nitride layer, a hafnium oxide layer, zirconium oxide layer, etc. or laminate of multiple such layers.

Figure 1F:
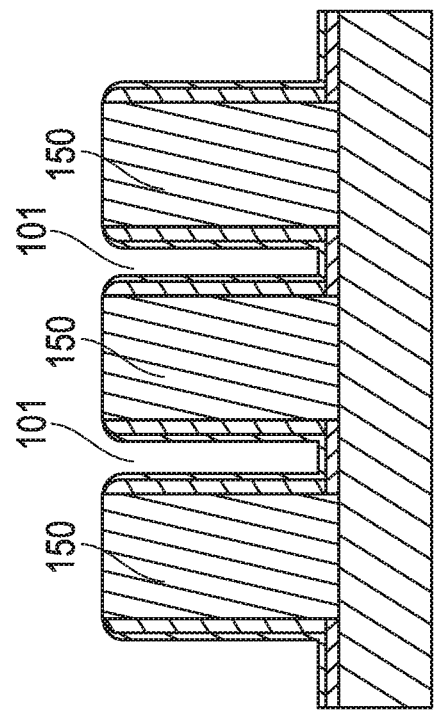
Figure 1G:
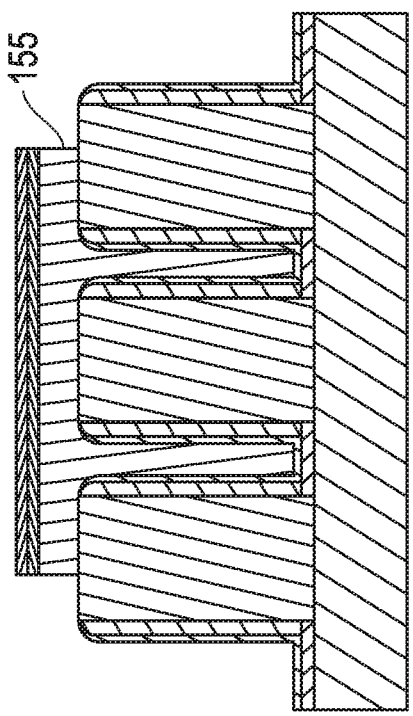
Figure 1H:
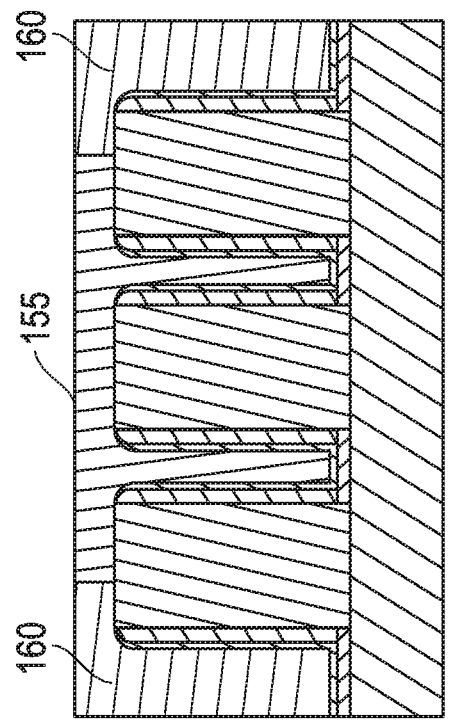
Figure 1I:
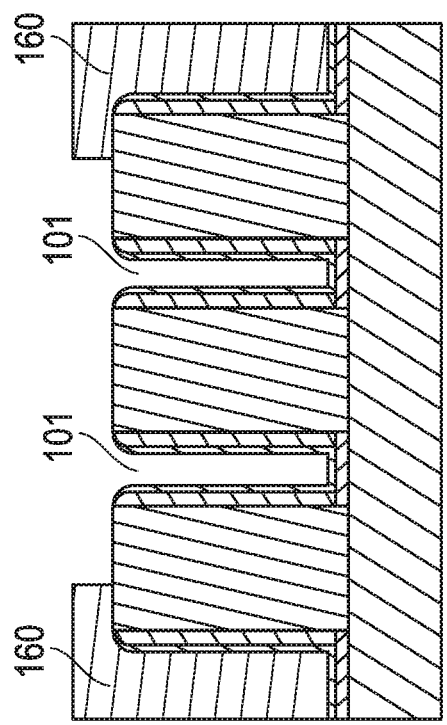

At this stage of the process flow the dielectric layer 120 may then be removed as shown in FIG. 1F. Etch stop layer 114 will operate as an etch stop for the process step used to remove dielectric layer 120. A blocking mask 155 may then be formed as shown in FIG. 1G. Blocking mask 155 may be a single layer or may be multiple layers. Blocking mask 155 may be merely one or more photolithography layers such as a photoresist material, may be a patterned layer left after a photolithography process, or may be a combination of both. In one embodiment, blocking mask 155 may be three layer photolithography blocking mask comprised of spin on carbon, spin on glass and photoresist. Other known photolithography stacks may also be used. A dielectric layer 160 may then be formed on the semiconductor device and planarized or etched back as shown in FIG. 1H. The blocking mask 155 may then be removed to leave the self-aligned contact regions 101 exposed while dielectric layer 160 remains in areas outside of the self-aligned contact regions 101 as shown in FIG. 1I. Though not shown in the figures, it will be recognized that standard contact formation processing techniques may then be used to form a self-aligned conductor in the self-aligned contact region 101 to make contact to the appropriate layer of the semiconductor device structure 100.

Returning to FIGS. 1E and 1F, part of the removal of dielectric layer 120 shown in the process steps between FIGS. 1E and 1F will be in the self-aligned contact regions 101. Thus, in order to protect the underlying layers of the contact region the selectivity in the removal process step of the dielectric layer 120 (for example oxide) to the etch stop layer 114 (for example silicon nitride) must be very high, exceeding in some cases even 100:1 selectivity. Such a process step can be challenging to implement in manufacturing and it would be desirable to provide an alternative process flow alleviating this challenge. The process flow described with regard to FIGS. 2A-2M provides such an alternative.

Figure 2A:
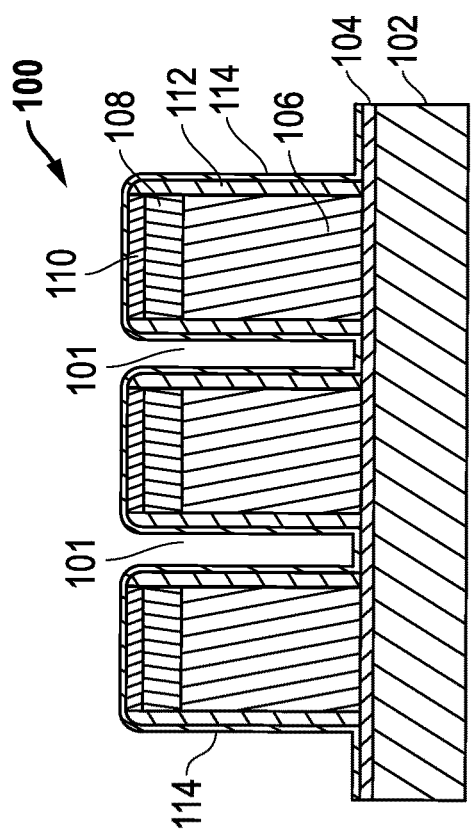
FIGS. 2A-2M illustrate an exemplary process flow utilizing a carbon material fill process as part of the formation of a self-aligned structure.

The challenges presented by the process steps at FIGS. 1E and 1F can be addressed by utilizing process integration techniques that add carbon layers as part of forming the self-aligned structures. Some of the process steps and layers of FIGS. 2A-2M correspond to the same steps and layers of FIGS. 1A-1I and like numbered reference numbers are utilized to indicate similar process steps and layers. As shown in FIG. 2A, a semiconductor structure 100 is provided that corresponds to the semiconductor structure 100 described above with reference to FIG. 1A. As shown in FIG. 2B, an etch stop layer 114 (in one example silicon nitride) is provided on the semiconductor structure 100, similar to that as described above with reference to FIG. 2A.

Figure 2C:
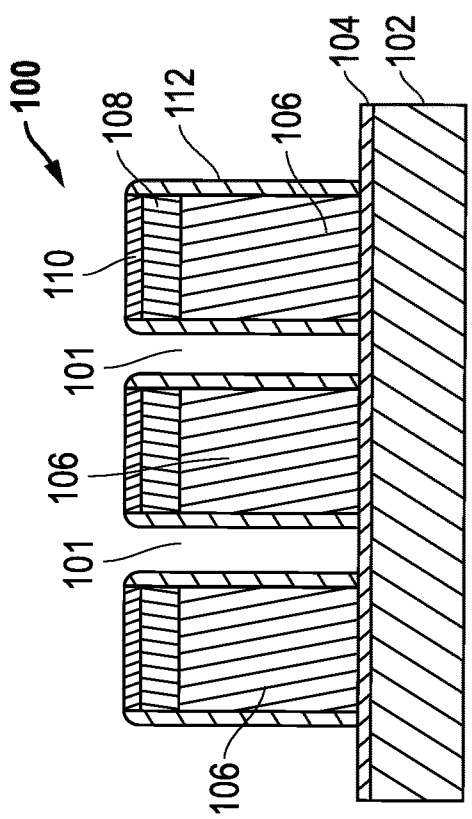
Figure 2B:
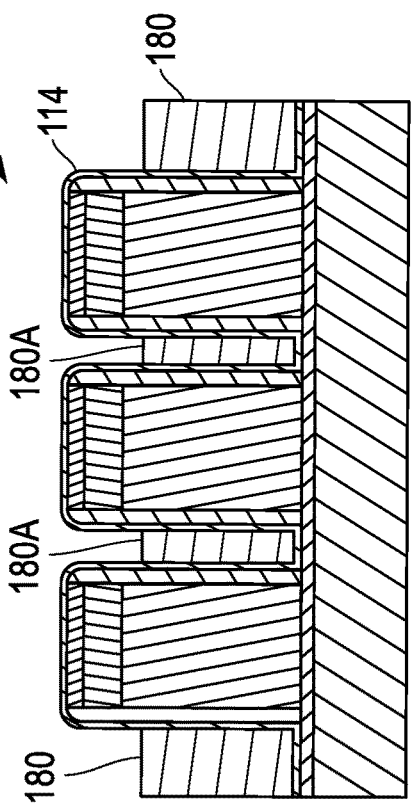

As shown in FIG. 2C, the next process step may include the provision of a carbon layer 180 over the semiconductor structure 100. The carbon layer 180 is a carbon material. As used herein, a carbon material is a material that contains carbon. The carbon layer 180 may be an atomic layer deposition (ALD) carbon material, spin on carbon (SoC) material, a chemical vapor deposition carbon material, organic planarization layer (OPL) material (which may also be spin on), a carbon based spin on hard mask (SoH) or other carbon based materials as known by those skilled in the art. For examples, carbon materials such as OPL from Shin-Etsu Chemical Co., SoH from Samsung SDI Co. Ltd., and SoC from Brewer Science, Inc. may be utilized. Thus, as used herein carbon materials may be carbon and/or carbon containing organic materials. It will be recognized that many other carbon materials may be utilized as would be known to those skilled in the art having the benefit of this disclosure and the ultimate material chosen may depend upon any particular process flow requirements regarding the aspect ratios, minimum pitch, step height requirements, etc.

Figure 2D:
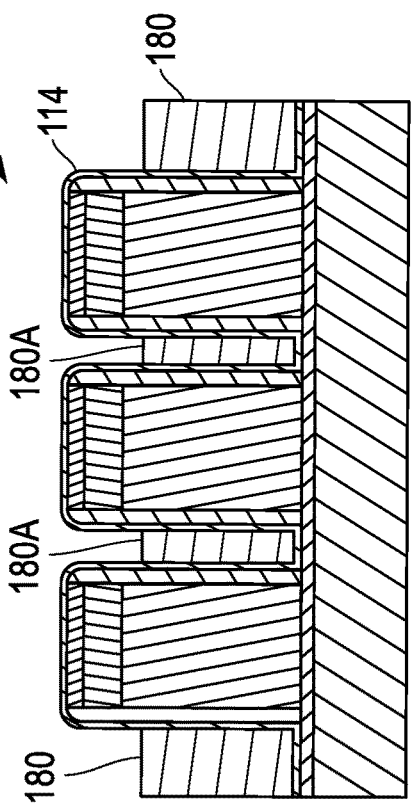

The carbon layer 180 may then be removed via an etch or planarization and etch process step to a point in which a portion of the carbon layer 180 is removed as shown in FIG. 2D. As shown in FIG. 2D, the removal of the carbon layer 180 is provided such that the height of the carbon layer is less than the height of the dummy silicon 106, first dummy silicon cap 108 and second dummy silicon cap 110 stack. Thus, as shown in FIG. 2D, recessed carbon layer portions are formed in the self-aligned contact regions as shown by carbon layer portions 180A. Next a cap layer 182 is provided to fill over the carbon layer 180 and carbon layer portions 180A as shown in FIG. 2E. In one embodiment, the cap layer 182 may be an oxide layer. The cap layer 182 may formed via a spin on process, plasma vapor deposition, chemical vapor deposition, atomic layer deposition, etc.

Figure 2F:
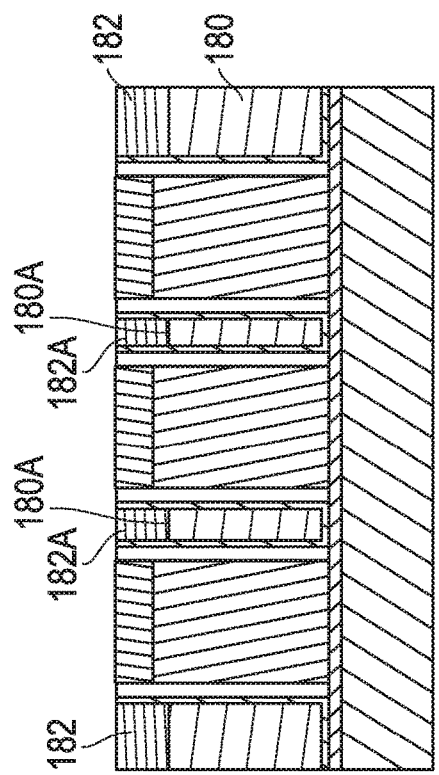

Next, an oxide removal step, for example a chemical mechanical planarization step, may be used to provide a resulting structure as shown in FIG. 2F. As shown in FIG. 2F, a planarized structure is provided with cap layer 182 having cap layer portions 182A remaining in the self-aligned contact region above the carbon layer portions 180A. Similar to as described above with regard to FIGS. 1D and 1E, the dummy silicon 106, first dummy silicon cap layer 108 and second dummy silicon cap layer 110 may then be removed from a gate region 140 and replaced with a gate dielectric (not shown) and gate conductor 150 as shown in FIG. 2H.

Figure 2H:
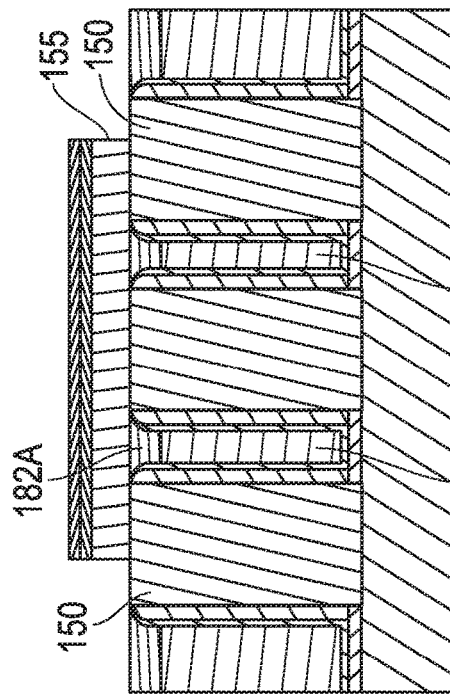
Figure 2E:
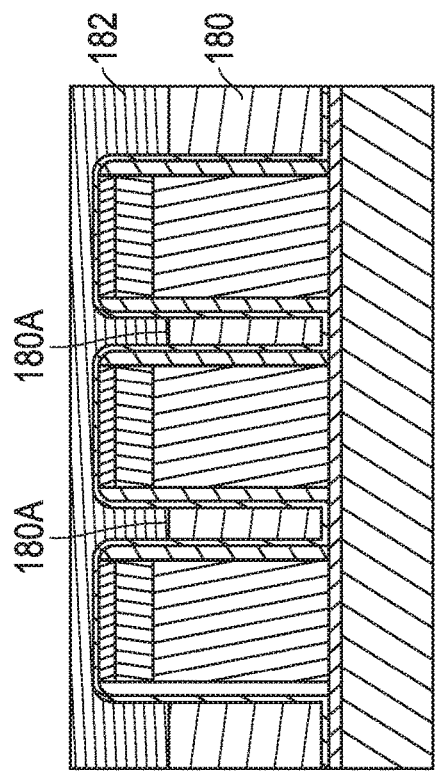
Figure 2G:
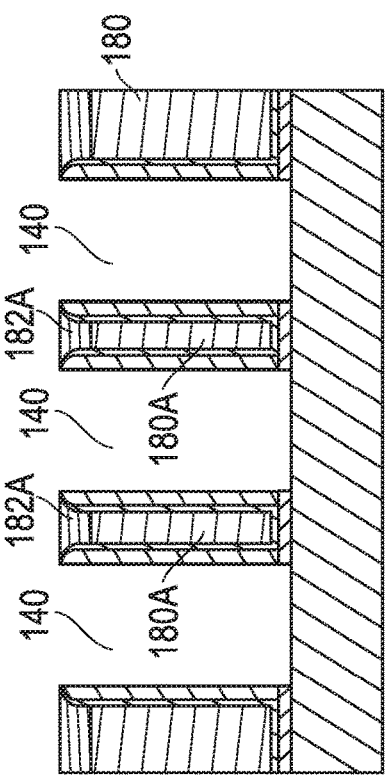
Figure 2I:
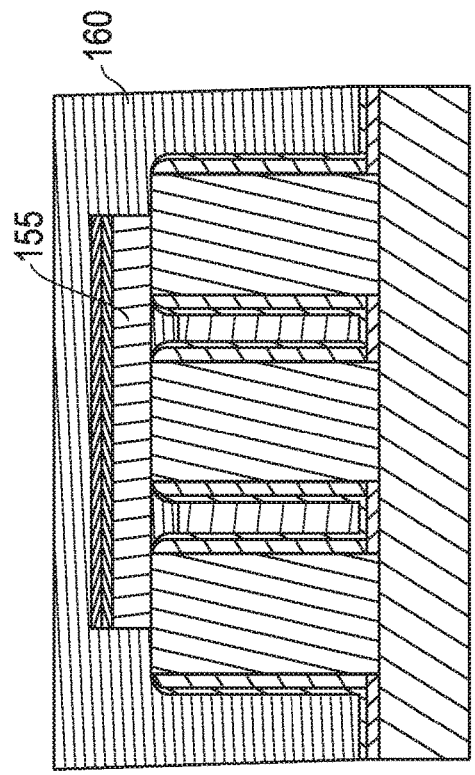
Figure 2J:
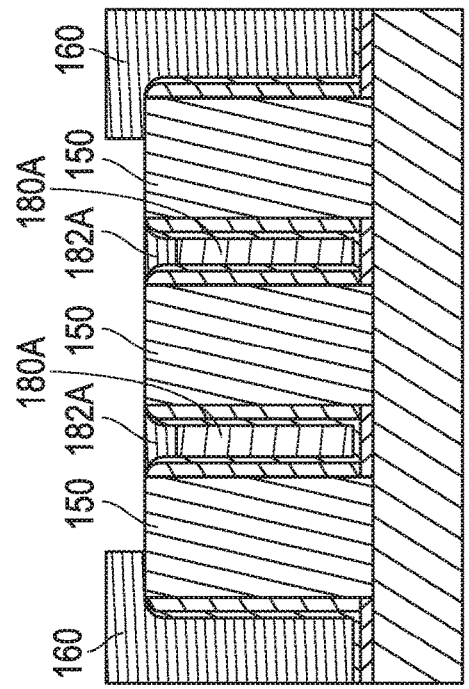
Figure 2K:
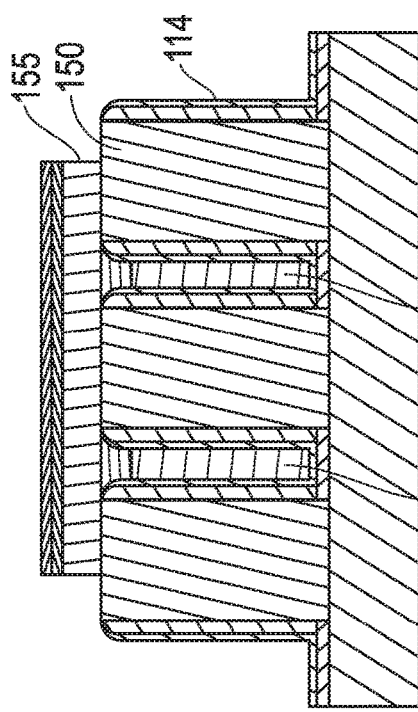

A blocking mask 155 may then be formed as shown in FIG. 2H, similar to that as shown in FIG. 1G. It will be noted, however, that the process of FIG. 2H retains the carbon layer portions 180A and cap layer portions 182A in the self-aligned contact regions 101 and thus the blocking mask 155 does not fill the self-aligned contact regions 101 as it did in FIG. 1G. As in FIG. 1H, the blocking mask 155 may be a single layer or may be multiple layers. Blocking mask 155 may be merely a photolithography layer such as a photoresist material, may be a patterned layer left after a photolithography process, or may be a combination of both. As shown, the blocking mask protects the self-aligned contact region. In this manner, the blocking mask is a tone inverted mask of the self-aligned contact regions that may be utilized to protect the self-aligned contact regions from certain subsequent process steps. In particular, after the blocking mask patterning, cap layer and carbon layer removal processes are performed to leave the structure as shown in FIG. 2I. As shown in FIG. 2J, the carbon layer portions 180A and cap layer portions 182A remain due to the blocking mask 155.

Figure 2L:
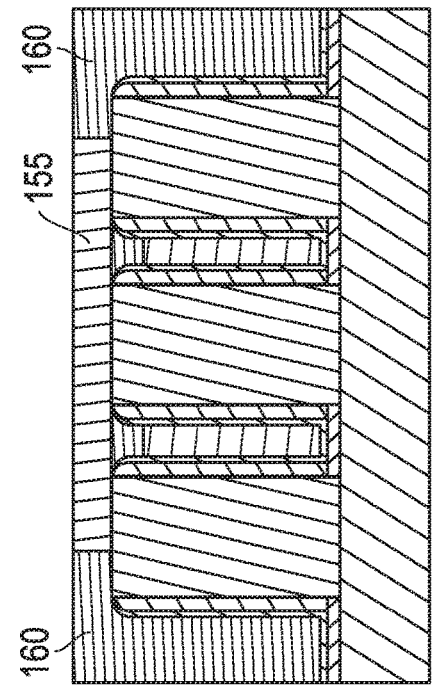
Figure 2M:
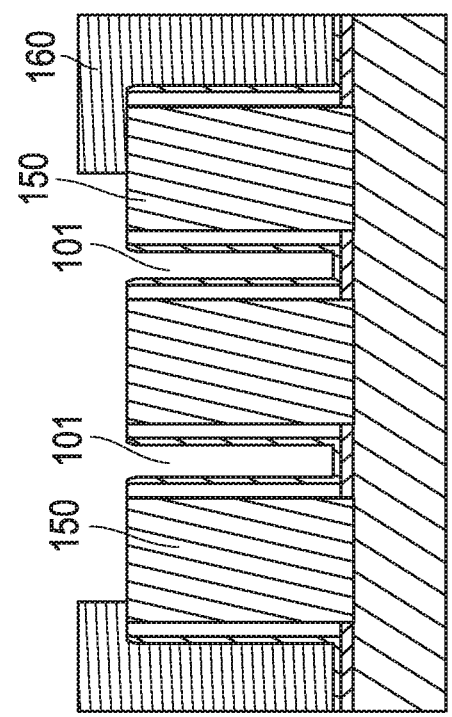

Next, a dielectric fill is performed as shown by FIG. 2J to provide dielectric layer 160 (for example an oxide layer 160). An etch back process is then utilized to provide the structure of FIG. 2K. For example, a dielectric etch back process such as reactive ion etching, chemical mechanical planarization, wet etching, location specific etch processing, dry chemical etch, etc. may be used. The process may be configured to remove none or part of the blocking mask 155. As shown in FIG. 2L, the blocking mask 155 may then be removed completely. Next, an oxide removal step may be performed to remove cap layer portions 182A followed by a carbon removal step to remove carbon layer portions 180A. Thus, the structure of FIG. 2M (similar to that of FIG. 1I) remains. Then, as known in the art, standard contact formation processing techniques may then be used to form a self-aligned conductor in the self-aligned contact region 101 to make contact to the appropriate layer of the semiconductor device structure 100.

With the benefit of this disclosure, an advantage of the carbon fill techniques describe above will be recognized by those skilled in the art in that that carbon layers may be easily removed via an etch which will not damage the layers below the carbon layer in the self-aligned contact region. Thus, carbon layers may be easily removed with very highly selective etches (for example greater than 100:1 selectivity) that provide selectivity to a variety of typical materials used in semiconductor process flows. For example, carbon layers may be removed with an oxygen plasma etch in a manner that will not damage the layers underlying the carbon fill. It will be recognized that any of a wide variety of ash etch chemistries may be utilized, including chemistries that contain O2, H2, N2, CO, COS, CO2, NH3, SO2. H2O, etc. or combinations thereof. In addition, it will be recognized that a gaseous reaction process may be utilized, such as for example, with O3. Alternatively, a wet etch designed for carbon material layers may also achieve the desired results. The carbon material that fills the high aspect ratio self-aligned contact region therefore can be safely removed even though the carbon layer is relatively thick compared to the relatively thin etch stop layer. Thus, by filling the self-aligned contact region with a carbon material, the fill material may be relatively easily removed without damaging the underlying layers. Further, the cap layer portions 182A provide protection to the carbon fill during other processing steps. In addition, as only a relatively thin cap layer is needed, the cap layer may be more easily removed without the same requirements when the entire self-aligned contact region is completely filled with oxide.

In one exemplary embodiment, the etch stop layer 114 may be a silicon nitride gate liner having a thickness of approximately one monolayer to 10 nm, the carbon layer portions 180A may have a width of approximately 5 A to 500 A and a height of approximately 200 A to 3000 A, and the cap layer portions 182A may be an oxide having a thickness of approximately 15 A-500 A. The carbon layer portions 180A may be removed with an oxygen plasma etch which provides a selectivity to the silicon nitride gate liner of at least 30:1 and preferably greater than 300:1

Though shown above as a process flow that includes an etch stop layer, carbon layer, and cap layer, it will be recognized that formation of the carbon layer over the etch stop layer may involve the use of one or more intervening layers between the etch stop layer and the carbon layer and/or between the carbon layer or the cap layer. Thus, the placement of one layer over the other layer does not mandate the layers be placed in direct contact. Furthermore, it will be recognized the carbon fill techniques described herein may be utilized in a process flow which does not have a cap layer and/or does not have a gate liner. It will also be noted that the etch stop layer 114 and cap layer 182 described above are in one embodiment a silicon nitride layer and an oxide layer respectively. It will be recognized that the materials for the etch stop layer and cap layer may be inverted, in one example an oxide etch stop and a silicon nitride cap layer. As noted above, however, many other materials may be utilized, and as will be recognized by those skilled in the art, the various example materials provided herein for various layers are merely exemplary.

Figure 3A:
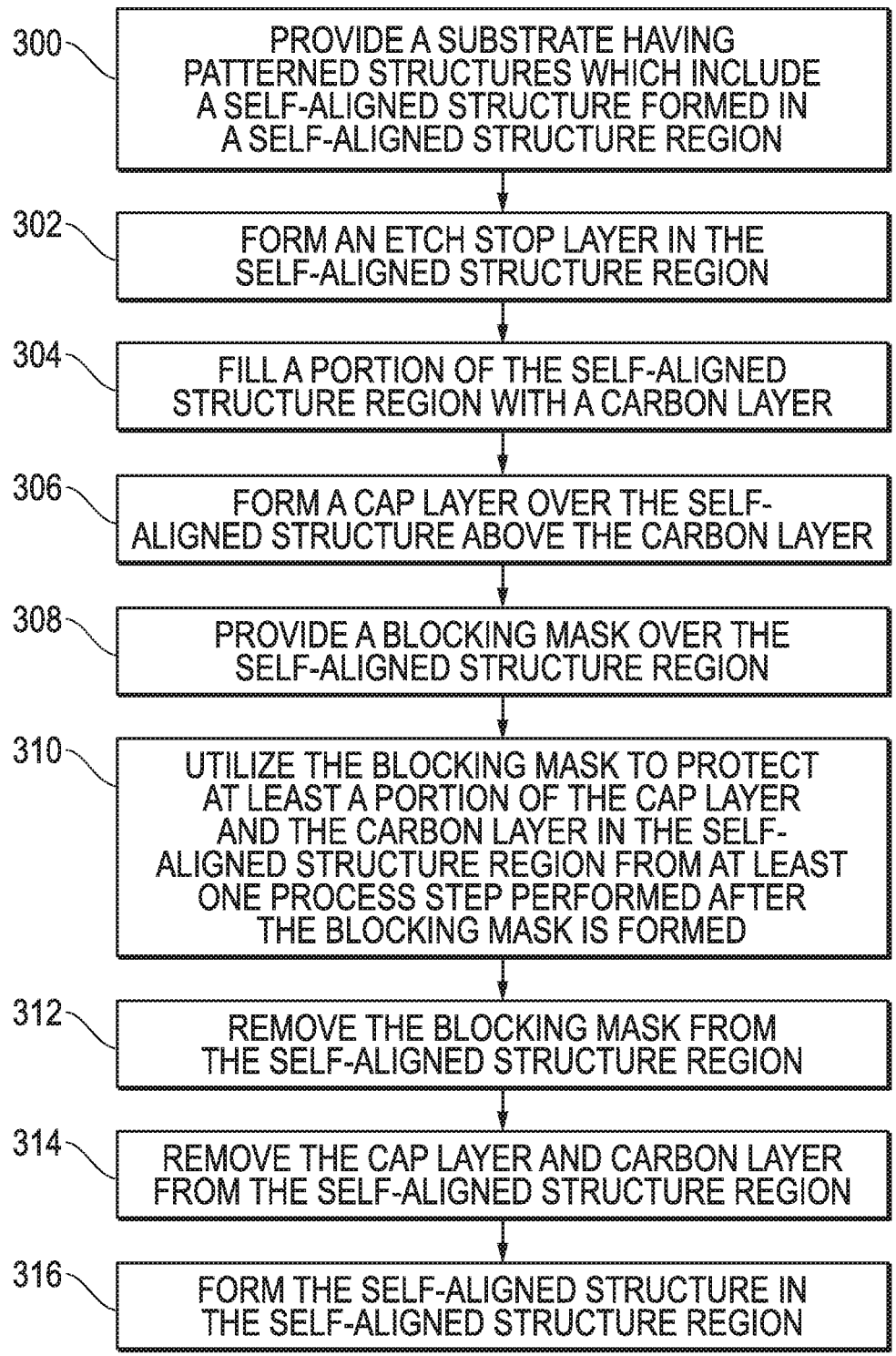
FIGS. 3A-3C illustrate flow charts for exemplary process flows utilizing a carbon fill process.

Exemplary process flows utilizing the techniques described above are shown with respect to FIGS. 3A-3B. It will be recognized that these process flows are merely exemplary and additional process flows may utilized the techniques described herein. Further, additional processing steps may be added to the process flows shown as the steps described are not intended to be exclusive. FIG. 3A provides a process flow for a method to form self-aligned structures including process steps 300-316. Step 300 includes providing a substrate with patterned structures, the patterned structures including a self-aligned structure region in which a self-aligned structure will be formed. Step 302 includes forming an etch stop layer in the self-aligned structure region. Step 304 includes filling at least a portion of the self-aligned structure region with a carbon layer. Step 306 includes forming a cap layer over the self-aligned structure region above the carbon layer. Step 308 includes providing a blocking mask over the self-aligned structure region. In step 310, the blocking mask is utilized to protect at least a portion of the cap layer and the carbon layer in the self-aligned structure region from at least one processing steps performed after the blocking mask is formed. Step 312 includes removing the blocking mask from the self-aligned structure region. Step 314 includes removing the cap layer and the carbon layer from the self-aligned structure region. Step 316 includes forming the self-aligned structure in the self-aligned structure region. It will be recognized by those skilled in the art that after step 316, many additional processing steps may occur.

Figure 3B:
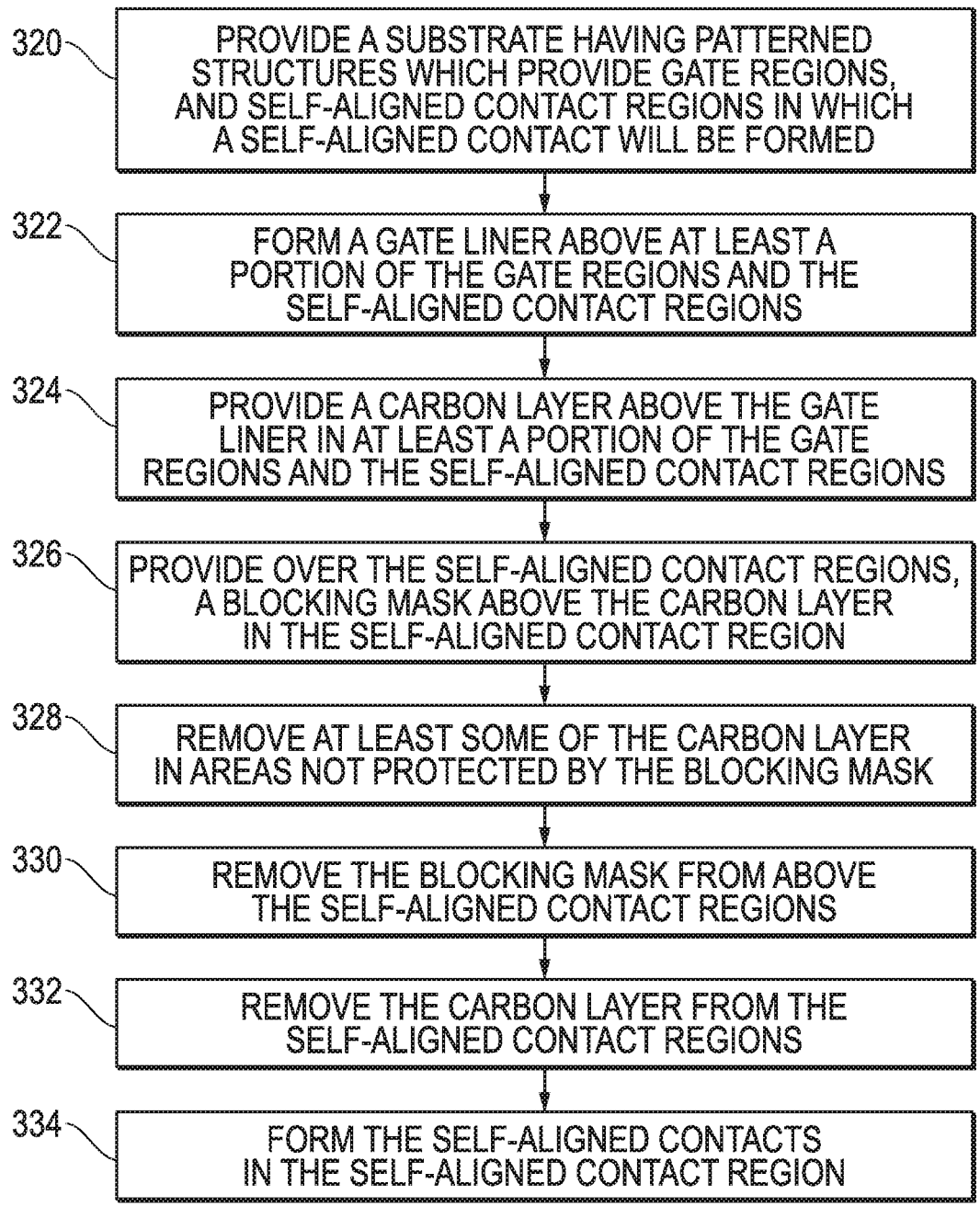

The process flow of FIG. 3B illustrates a method of utilizing a tone inversion process step to form self-aligned contacts, including process steps 320-334. Step 320 includes providing a substrate having patterned structures which provide gate regions and self-aligned contact regions in which a self-aligned contact will be formed. Step 322 includes forming a gate liner above at least a portion of the gate regions and the self-aligned contact regions. Step 324 includes providing a carbon layer above the gate liner in at least a portion of the gate regions and the self-aligned contact regions. Step 326 includes providing, over the self-aligned contact regions, a blocking mask above the carbon layer in the self-aligned contact regions. Step 328 includes removing at least some of the carbon layer in areas not protected by the blocking mask. Step 330 includes removing the blocking mask from above the self-aligned contact regions. Step 332 includes removing the carbon layer from the self-aligned contact regions. Step 334 includes forming the self-aligned contacts in the self-aligned contact regions. It will be recognized by those skilled in the art that after step 334, additional processing steps may occur.

Figure 3C:
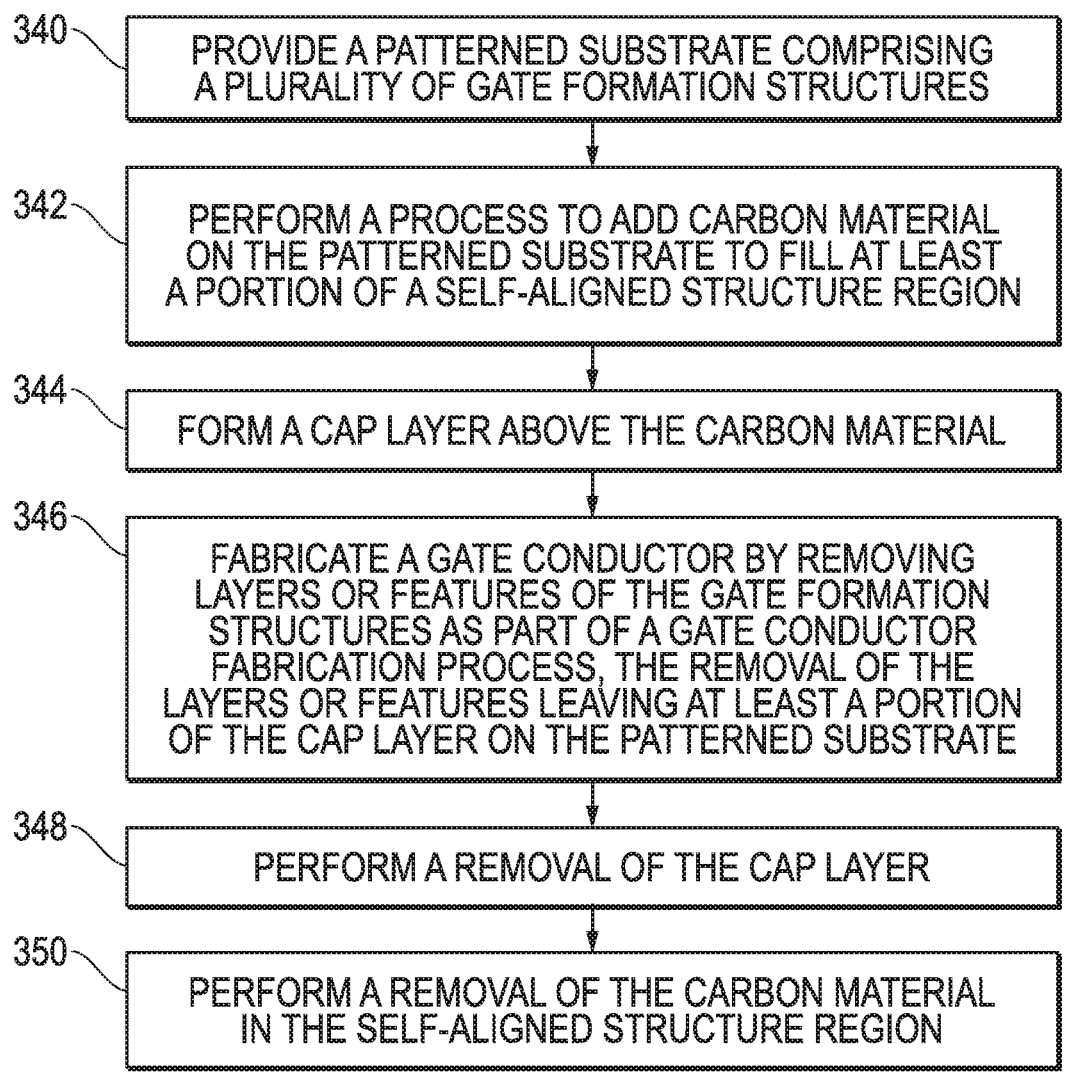

The process flow of FIG. 3C illustrates a method of tone inversion processing for providing self-aligned structures, including process steps 340-350. Step 340 includes providing a patterned substrate comprising a plurality of gate formation structures. Step 342 includes performing an atomic layer deposition, chemical vapor deposition, or spin on process to add carbon material on the patterned substrate, the carbon material filling at least a portion of a self-aligned structure region, the self-aligned structure region being where the self-aligned structures will be subsequently formed. Step 344 includes forming a cap layer above the carbon material. Step 346 includes fabricating a gate conductor by removing layers or features of the gate formation structures as part of a gate conductor fabrication process, the removal of the layers or features leaving at least a portion of the cap layer on the patterned substrate. Step 348 includes performing a removal of the cap layer. Step 350 includes performing a removal of the carbon material in the self-aligned structure region. It will be recognized by those skilled in the art that after step 350, additional processing steps may occur.

It will also be recognized that the concept of utilizing a carbon fill layer may be utilized with regard to semiconductor structures other than the self-aligned contact structure shown. Further, though shown with regard to a front end of line (FEOL) structure, the concepts described herein may be utilized with a back end of line (BEOL) structure.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method to form self-aligned structures, the method comprising:
   providing a substrate with patterned structures, the patterned structures including a self-aligned structure region in which self-aligned structures will be formed;
   forming an etch stop layer in the self-aligned structure region;
   filling at least a portion of the self-aligned structure region with a carbon layer;
   forming recessed carbon layer portions in the self-aligned structure region, wherein a height of each recessed carbon layer portion is lower than a height of the self-aligned contact regions;
   forming a cap layer over the self-aligned structure region above the recessed carbon layer portions;
   removing the patterned structures;
   forming the self-aligned structures by replacing each patterned structure with a conductor to provide a self-aligned contact in the self-aligned contact region;
   providing a blocking mask over the self-aligned structures to protect at least a portion of the cap layer and the recessed carbon layer portions in the self-aligned structure region from at least one processing steps performed after the blocking mask is formed;
   removing at least some of the cap layer and the recessed carbon layer portions not protected by the blocking mask;
   removing the blocking mask from the self-aligned structure region; and
   removing the cap layer and the recessed carbon layer portions from the self-aligned structure region.

2. The method of claim 1, further comprising removing the recessed carbon layer portions from regions outside of the self-aligned structure region, wherein the blocking mask is utilized to protect the self-aligned structure region during the processing steps which remove the recessed carbon layer portions from regions outside of the self-aligned structure region.

3. The method of claim 2, wherein the carbon layer comprises at least one of an atomic layer deposition (ALD) carbon material, spin on carbon (SoC) material, a chemical vapor deposition carbon material, organic planarization layer (OPL) material or a spin on hard mask (SoH) carbon material.

4. The method of claim 2, further comprising after removing the recessed carbon layer portions from regions outside of the self-aligned structure region, providing a dielectric layer in regions not protected by the blocking mask prior to the removing the blocking mask step.

5. The method of claim 4, wherein the etch stop layer is a gate liner.

6. The method of claim 5, wherein the carbon layer is formed via a spin on process.

7. The method of claim 4, wherein, in providing the dielectric layer in regions not protected by the blocking mask prior the removing the blocking mask step:
   the dielectric layer is provided to surround portions of the blocking mask.

8. The method of claim 1, wherein the carbon layer is formed via a spin on process.

9. The method of claim 1, wherein prior to providing the blocking mask, at least a portion of the cap layer is within the self-aligned structure region.

10. The method of claim 9, wherein the filling at least a portion of the self-aligned structure region with the carbon layer includes:

completely filling the self-aligned structure region with the carbon layer.

11. A method of utilizing a tone inversion process step to form self-aligned contacts, the method comprising:
   providing a substrate having patterned structures which provide gate regions and self-aligned contact regions in which a self-aligned contact will be formed;
   forming a gate liner above at least a portion of the gate regions and the self-aligned contact regions;
   providing a carbon layer in a portion of the self-aligned contact regions;
   forming recessed carbon layer portions in the self-aligned structure region, wherein a height of each recessed carbon layer portion is lower than a height of the self-aligned contact regions;
   removing the patterned structures;
   forming self-aligned contacts in the self-aligned contact regions;
   providing, over the self-aligned contacts, a blocking mask above the recessed carbon layer portions in the self-aligned contact regions;
   removing at least some of the recessed carbon layer portions in areas not protected by the blocking mask;
   removing the blocking mask from above the self-aligned contact regions; and
   removing the recessed carbon layer portions from the self-aligned contact regions.

12. The method of claim 11, wherein the carbon layer comprises at least one of an atomic layer deposition (ALD) carbon material, spin on carbon (SoC) material, a chemical vapor deposition carbon material, organic planarization layer (OPL) material or a carbon based spin on hard mask (SoH).

13. The method of claim 11, further comprising providing a dielectric in areas not protected by the blocking mask prior to removing the blocking mask.

14. The method of claim 13, wherein the recessed carbon layer portions are removed from the self-aligned contact regions by utilizing an oxygen plasma etch.

15. The method of claim 13, wherein in providing the dielectric in areas not protected by the blocking mask, the dielectric is provided to surround portions of the blocking mask.

16. The method of claim 15, further including providing a cap layer within the self-aligned contact regions and above the recessed carbon layer portions prior to providing the blocking mask, and
   wherein the self-aligned contacts include a conductor within the self-aligned contact regions previously filled and covered by the carbon layer, the cap layer, and the blocking mask.

17. The method of claim 11, further comprising forming a cap layer above the recessed carbon layer portions in at least the self-aligned contact regions, and at least part of the cap layer is within the self-aligned contact regions.

18. The method of claim 17, wherein the cap layer protects the recessed carbon layer portions in at least the self-aligned contact region from at least some processing steps performed after formation of the cap layer.

19. The method of claim 17, wherein the gate liner is a silicon nitride and the cap layer is an oxide.

20. The method of claim 11, wherein the providing of the carbon layer includes:
   providing the carbon layer to extend over the gate regions, and to fill and extend above the self-aligned contact regions; and
   wherein the method further includes forming a cap layer on the recessed carbon layer portions after forming the recessed carbon layer portions, with at least part of the cap layer within the self-aligned contact regions, and
   wherein the blocking mask is provided above the cap layer.

* * * * *